(12) United States Patent
Shoham

(10) Patent No.: US 6,373,411 B1
(45) Date of Patent: Apr. 16, 2002

(54) METHOD AND APPARATUS FOR PERFORMING VARIABLE-SIZE VECTOR ENTROPY CODING

(75) Inventor: Yair Shoham, Watchung, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/652,931

(22) Filed: Aug. 31, 2000

(51) Int. Cl.$^7$ ................................................ H03M 7/40
(52) U.S. Cl. .......................................... 341/65; 341/50
(58) Field of Search ............................. 341/50, 51, 67, 341/65

(56) References Cited

U.S. PATENT DOCUMENTS 4,821,119 A  *  4/1989  Gharavi ...................... 358/136
5,642,242 A  *  6/1997  Ozaki ........................... 360/48

OTHER PUBLICATIONS

D. Huffman, "A Method For The Construction Of Minimum Redundancy Codes," Proc. IRE 40, pp. 1098–01191, 1952.
G. V. Cormack, et al., "Algorithms For Adaptive Huffman Codes," Inf. Proc. Letters, 18, Mar., 1984, pp. 159–165.
J. Rissanen, et al., "Arithmetic Coding," IBM J. Res. 23, 2 (Mar.), pp. 149–162, 1979.
A. Moffat, et al., "Arithmetic Coding Revisited," ACM Trans., On Information Systems, vol. 16, No. 3, Jul. 1998, pp. 256–294.
S. A. Savari, et al., "Generalized Tunstall Codes For Sources With Memory," IEEE Trans. IT, vol. 43, No. 2, pp. 658–667, Mar. 1997.
M. A. Gerzon, et al., "The MLP Lossless Compression System," AES 17$^{th}$, Int. Conf. on High Qual. Audio Coding, pp. 1–15, Sep. 1999.

(List continued on next page.)

*Primary Examiner*—Peguy JeanPierre

(57) ABSTRACT

A method and apparatus for performing entropy coding and decoding of a sequence of coded symbols representative of, for example, a speech, audio or video signal, in which variable-size vectors are coded and decoded based on radix arithmetic. The encoding technique uses a first radix and the numerical values of individual symbols to be coded, in order to determine the length of a first subsequence of symbols, which is then coded with use of a single (a first) combined symbol, and uses a second radix and the numerical values of other individual symbols to be coded, in order to determine the length of a second subsequence of symbols, which is then also coded with a single (a second) combined symbol, wherein the length of the first and second subsequences of symbols are also based on the size of the set from which the combined symbols are selected. The number of symbols in the first subsequence and the second subsequence are unequal—that is, the vectors (i.e., subsequences) which are combined for coding have a variable size. The first radix and the second radix may be equal and fixed to a predetermined value, or they may each be determined based on the corresponding subsequence of symbols to be coded. Correspondingly, the decoding technique of the present invention determines from the bit stream the number of symbols which have been coded with use of a single combined symbol (i.e., the length of a coded subsequence), and based on that number, on the combined symbol itself, and on a given radix (which may be fixed or may also be determined from the bit stream), determines the values of the individual symbols which were coded together as the combined symbol.

48 Claims, 3 Drawing Sheets

OTHER PUBLICATIONS

P. Craven, et al., "Lossless Coding For Audio Discs," J. Audio Eng. Soc., vol. 44, No. 9 pp. 706–720, Sep. 1996.

P.A. Chou, et al., "Entropy–Constrained Vector Quantization," IEEE Trans. Acoust, Sp. and Sig. Proc. 37(1), pp. 31–42, Jan. 1989.

J. Ziv, et al., "A Universal Algorithm For Sequential Data Compression," IEEE Trans. Inf. Theor., vol. IT–23, No. 3, pp. 337–343, 1997.

J. P. Pincen, et al., "Subband/Transform Coding Using Filter Bank Designs Based On Time Domain Aliasing Cancellation," IACSSP '87, pp. 2161–2167, 1987.

N. Iwakami, et al., High–Quality Audio Coding At Less Than 64 Kbps Using Transform–Domain Wighted Interleave Vector Quantization (Twin VVQ), ICASSP '95, pp. 3095–3098, 1995.

S. R. Quackenbush, et al., "Noiseless Coding Of Quantized Spectral Components In MPEG–2 Advanced Audio Coding," IEEE Workshop On Applications Of Signal Processing To Audio And Acoustics, WASPAA '97, Session 3. Paper No. 3, 1997.

S. Deligne, "Language Modeling By Variable Length Sequences: Theoretical Formulation And Evaluation Of Multigrams," ICASSP '95 pp. 169–172, 1995.

F. Bimbot, et al., "Variable–Length Sequence Modeling: Multi–Grams", IEEE Signal Processing Letters, vol. 2, No. 6, Jun. 1995.

S. Roucus, et al., "Stochastic Segment Modelling Using The Estimate–Maximize Algorithm," ICASSP '88 pp. 127–130, 1998.

* cited by examiner

METHOD AND APPARATUS FOR PERFORMING VARIABLE-SIZE VECTOR ENTROPY CODING

FIELD OF THE INVENTION

The present invention relates generally to the field of lossless (i.e., entropy) coding for storage or transmission of, for example, source coded speech, audio, or video signals, and more particularly to a method and apparatus for performing entropy coding based on variable-size symbol vectors for achieving higher compression ratios.

BACKGROUND OF THE INVENTION

Source coding is an essential step in modern digital communication networks and systems. Specifically, it is used to convert sources like speech, audio, video and many other analog waveforms (signals) into a digital representation (i.e., a sequence of bits), and may further compress this representation into a shorter bit stream. This digital representation (i.e., the bit stream) may then be used either for purposes of efficient storage for subsequent decoding and use, or for purposes of efficient transmission for decoding at the other end of a communications channel. The source encoder which creates and/or compresses the digital representation of the signal, and the decoder which ultimately synthesizes a reconstruction of the original signal from the (possibly compressed) digital representation, are jointly designed to meet certain application-dependent performance criteria. Most notably, the decoded source should advantageously be of a satisfactory quality (e.g., to the ear or the eye), while the information rate (i.e., the number of bits used in the representation of a given portion of the original signal) is at or below the capacity of the storage or transmission medium. Other important criteria may include those related to, for example, robustness, delay, complexity, price, etc.

The encoding process is often carried out in two steps. The first step comprises "lossy" transformation of the analog data into discrete symbols defined over a finite alphabet. By "lossy" it is meant that there is information content which is contained in the original signal but not in the digital representation (i.e., the sequence of discrete symbols) produced. The second step comprises a "lossless" compression of the discrete symbol data, which amounts to describing exactly the same data (i.e., with no loss of information content), but with fewer symbols (ie., fewer bits). This second step is commonly referred to as entropy coding ("EC") because it attempts to reduce the information content to that inherent in the symbol source, as measured by the source entropy. Often the distinction between these two steps is vague or impossible. (See, e.g., "Entropy-constrained vector quantization" by P. A. Chou et al., IEEE Trans. Acoust., Sp. and Sig. Proc. 37(1), pp. 31–42, January 1989.) Sometimes, one step is entirely missing, as in certain standardized speech coders, such as, for example, in International Telecommunication Union (ITU) standards G.728 and G.729, where no entropy coding is used, or in the case of conventional file compression techniques, such as, for example, the Ziv-Lempel technique and its derivatives, where no lossy coding is used. (ITU standards G.728 and G.729, as well as the Ziv-Lempel file compression technique and its derivatives, are each fully familiar to those of ordinary skill in the art.) In the simplest entropy coding applications, the source symbols are processed individually (referred to as "per-letter EC"). This may, for example, be accomplished using techniques such as Huffman coding or arithmetic coding, each of which is fully familiar to those of ordinary skill in the art. More complex EC coders parse the source output sequence into fixed or variable-size strings or vectors. These new vector-symbols are then losslessly coded. This approach is referred to as vector entropy coding ("VEC") as opposed to the simpler per-letter EC. Typically, the most common use of VEC is in the Ziv-Lempel family of file compression coders, although their use in other coders has also been proposed. (See, e.g., "Generalized Tunstall Codes for Sources With Memory" by S. A. Savari et al., IEEE Trans. IT, Vol. 43 No. 2, pp. 658–667, March 1997.) The advantage of VEC is in its use of inter-symbol dependencies to achieve high compression ratios, which results from the fact that the entropy of the combined symbols is never greater than that of the elementary symbols and most of the times it is significantly lower. The longer the vector-symbols (i.e., the higher the number of elementary symbols included in a given vector), the higher the coding efficiency that can be achieved, compared to that of per-letter EC. On the other hand, the coding complexity of VEC often grows exponentially with the vector size and may quickly become unmanageable. Moreover, VEC coders usually require a considerable "look-ahead" of long future data strings before coding can be performed on a given vector. In communications applications, this may translate into a long coding delay and large data buffering requirements, which impair communication efficiency. Therefore, VEC has been primarily employed for off-line applications like file compression (e.g., for purposes of storage).

For the above reasons, on-line communications applications, in which fast and relatively inexpensive processing is usually required, have most typically employed per-letter EC coding, although various techniques have been proposed to make this per-letter encoding as efficient as possible. (See, e.g., "Lossless Coding for Audio Discs" by P. Craven et al., J. Audio Eng. Soc., Vol. 44 No. 9, pp. 706–720, September 1996.) In some modern audio coders, however, an attempt is made to employ the VEC concept in a simple, restricted way. For example, the quantizer symbols which are generated by the lossy compression portion of the audio coder may be grouped in vectors of various predetermined sizes, and these new "composite" symbols may then, for example, be Huffman coded. (See, e.g., "Noiseless Coding of Quantized Spectral Components in MPEG-2 Advanced Audio Coding" by S. R. Quackenbush et al., IEEE Workshop on Applications of Signal Processing to Audio and Acoustics, WASPAA '97, Session 3, Paper No. 3, 1997, which groups quantizer symbols in vectors of size 1, 2 or 4, and Huffman codes the new composite symbols.)

It would be advantageous if an enhanced VEC technique were available in which higher compression rates than those of prior art techniques were achieved while maintaining a reasonable level of complexity. In particular, a technique which provided for variable-size vector entropy coding (referred to herein as "VSVEC") in an easy and efficient manner would be highly desirable.

SUMMARY OF THE INVENTION

In accordance with the present invention, an illustrative method and apparatus is provided in which the simplicity of radix arithmetic may be advantageously employed to effectuate a low-complexity variable-size vector entropy coding (VSVEC) technique which achieves high compression rates, by coding each (variable-size) vector with use of a calculated "combined" symbol. In particular, the illustrative technique in accordance with the present invention advantageously permits variable-size vectors to be entropy coded based on the particular symbols in the vector, based on a size of a set from which combined symbols are to be selected for coding (e.g., an "alphabet" size), and, in accordance with certain illustrative embodiments, based either on a variable, determined numerical radix value, or, alternatively, on a fixed, predetermined numerical radix value. As such, the vector size may be as small as a single symbol, or may be as large as an entire frame of a source (e.g., speech, audio or video) signal (which may, for example, comprise several hundred or even several thousand symbols).

Specifically, the encoding technique of the present invention uses the numerical values of a subsequence of individual symbols to be coded, together with a size of a set of combined symbols, in order to determine the length (ie., the number of included symbols) of a first subsequence of symbols, which is then coded with use of a single (a first) combined symbol selected from the set; and uses the numerical values of another sequence of individual symbols to be coded, together with the size of the set of combined symbols, in order to determine the length (i.e., the number of included symbols) of a second subsequence of symbols, which is then also coded with a single (a second) combined symbol. Moreover, the number of symbols in (i.e., the length of) the first subsequence and the number of symbols in (i.e., the length of) the second subsequence are unequal—that is, the subsequences of symbols which are combined and coded together are of a variable length.

In accordance with certain illustrative embodiments of the present invention, the lengths of the first subsequence of symbols and of the second subsequence of symbols may also be based on a first numerical radix and a second numerical radix, respectively. The first radix and the second radix may be equal and fixed at a predetermined value, or they may each be determined based on the corresponding subsequence of symbols to be coded.

Correspondingly, the decoding technique of the present invention determines from the bit stream the number of symbols which have been coded with use of a single combined symbol (i.e., the length of a coded subsequence), and based on that number, on the combined symbol itself, and on a given radix (which may be fixed or which may also be determined from the bit stream), determines the values of the individual symbols which were coded together as the combined symbol.

More specifically, the present invention comprises a method and apparatus for performing entropy coding of a sequence of symbols, each of said symbols having a numerical value associated therewith, the method or apparatus comprising steps or means for identifying a first subsequence of said symbols, the first subsequence of said symbols having a first number of symbols included therein, the first number of symbols being based on the numerical values associated with said symbols included in said first subsequence of said symbols and further based on a size of a set of combined symbols; coding the first subsequence of symbols with use of a first combined symbol representative of said first subsequence of symbols and with use of a symbol representative of the first number of symbols, wherein said first combined symbol is a member of said set of combined symbols; identifying a second subsequence of said symbols, the second subsequence of said symbols having a second number of symbols included therein, the second number of symbols being based on the numerical values associated with said symbols included in said second subsequence of said symbols and further based on said size of said set of combined symbols, wherein said second number of symbols differs from said first number of symbols; and coding the second subsequence of symbols with use of a second combined symbol representative of said second subsequence of symbols and with use of a symbol representative of the second number of symbols, wherein said second combined symbol is a member of said set of combined symbols.

In addition, the present invention comprises a method and apparatus for decoding a bit stream, the bit stream comprising an entropy encoding of an original sequence of symbols, each of said symbols in said original sequence having a numerical value associated therewith, the method or apparatus comprising steps or means for decoding a portion of said bit stream which comprises a coded symbol representative of a number of symbols which are included in a given subsequence of said original sequence and which have been coded with use of a combined symbol, thereby determining said number of symbols which have been combined in said subsequence; decoding a portion of said bit stream which comprises said coded combined symbol representative of said subsequence of symbols in said original sequence, said subsequence containing said determined number of symbols; and determining said numerical values associated with said symbols in said subsequence based on the decoded portion of said bit stream which comprises said coded combined symbol, and further based on said determined number of symbols and on a numerical radix.

DETAILED DESCRIPTION

Overview of the Inventive Coding Technique

Figure 1:
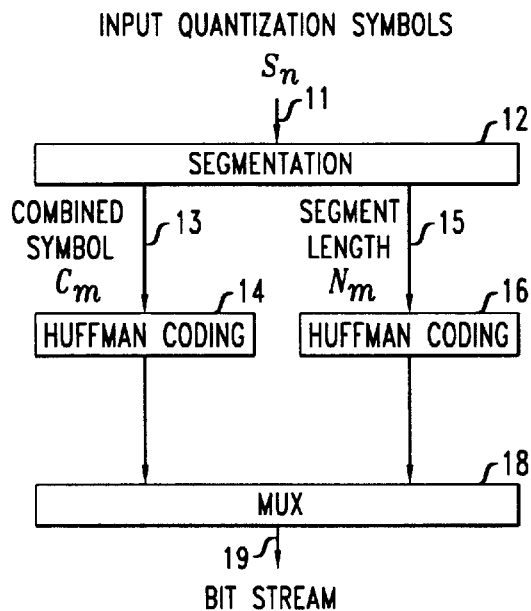
FIG. 1 shows a high-level flowchart of a first illustrative embodiment of an encoder in accordance with the principles of the present invention in which a variable-size vector of symbols is entropy coded with use of a fixed radix.

Let $S_n$ be a discrete information symbol generated by a lossy coder. This is typically (but not necessarily) an output of a scalar or vector quantizer utilized by the coder in order to discretize the raw analog data. This is invariably generated in such a manner so as to keep the resulting distortion as low as possible. Since the nature or the "value" of $S_n$ is immaterial from an entropy coding point of view, we can assume, without loss of generality, that $S_n$ is a non-negative integer in the range $0, \ldots, S-1$. The symbols are typically organized in frames (i.e., blocks) of size N and are processed frame by frame. The index n, $n=0, \ldots, N-1$ points to the location of the symbol in the current frame. The objective is to losslessly encode $S_n$ by applying VSVEC in accordance with the principles of the present invention. In the illustrative embodiments described herein, we apply VSVEC to each frame independently, advantageously preventing any frame-to-frame error propagation in case of a noisy communication channel, which is desirable especially in packet-based communication (assuming a packet consists of one frame). The principles of the present invention, however, can be easily extended as an inter-frame (predictive) coding algorithm to gain coding efficiency due to inter-frame redundancy, by, for example, permitting the combined coding of (variable-size) vectors which extend across frame boundaries. In particular, techniques for implementing such extensions are straightforward and will be obvious to those of ordinary skill in the art.

The first step in the illustrative VSVEC process in accordance with the present invention is the grouping of the symbols $S_n$ into variable-size vectors represented by a new set of combined symbols $C_m$ where the index m points to the m'th such symbol in the current frame. The number of symbols used in forming $C_m$ is denoted by $N_m$. In general, the forming of $C_m$ may be done by sparsely collecting symbols $S_m$ at intervals greater than 1, but in accordance with the illustrative embodiments described herein, we use only contiguous and non-overlapping grouping. In other words, the main frame is segmented into variable-size sub-frames. Extensions of the principles of the present invention to various non-contiguous grouping of symbols will be obvious to those skilled in the art.

Except for the contiguity requirement, the segmentation is advantageously unconstrained. Each subframe can be of any size, up to the main frame size N. The new combined symbols $C_m$ represent vectors (subframes) of varying size drawn from vector-alphabets of varying sizes. In accordance with the illustrative embodiments described herein, the concept of source mixing is adopted. For the purpose of subsequent lossless coding, the symbols $C_m$ may all be considered single-source symbols. The statistics of this single (mixed) source is implicitly built of the statistics of the original source $S_n$, including the dependencies within varying-size groups of symbols. In accordance with other illustrative embodiments of the present invention (not described herein), which will also be obvious to those skilled in the art, it is possible to associate each symbol $C_m$ with its own separate source, depending on the subframe size (and, possibly, on subframe location within the main frame). However, in accordance with the illustrative embodiments of the present invention described herein, the combined symbols $C_m$ are advantageously coded by the same Huffman (or other) lossless coder, optimized for that mixed source.

Overview of an Illustrative Segmentation Technique

In accordance with certain illustrative embodiments of the present invention, the segmentation algorithm advantageously attempts to maximize the size of each subframe (i.e., the vector length) subject to a limit on the size of the combined symbol alphabet, and hence, subject to a limit on algorithmic complexity. This approach advantageously separates the segmentation process itself from the subsequent lossless coding step, and moreover, it is simple, fast, readily realizable and effective in the sense that it produces a small number of large segments whenever possible. The subsequent Huffman coder is advantageously optimized for the segmentation output and, therefore, the coded bit stream is generally short.

Note that in accordance with various other illustrative embodiments of the present invention, other complexity measures, each effectively limiting the size of the set from which the combined symbol is selected, may be used. For example, the size of the set may be indirectly limited by CPU speed, by a desired maximum decoding delay, by issues of cost (e.g., encoder and/or decoder implementation complexity), or by other complexity limits which will be obvious to those skilled in the art. In the specific cases described herein, it may be assumed for the sake of illustrative simplicity that the size of the combined symbol set (e.g., the alphabet size) is limited by a (possibly fixed) quantity of available memory space, which is used, for example, as a coding table in accordance with the given encoding technique (e.g., Huffman coding) which is employed.

Specifically, the illustrative algorithm is based on mapping subframes to combined symbols $C_m$ by using variable-radix arithmetic. Let $R_m > 0$ be a radix (basis) for the m'th combined symbol. Then, $$C_m = \sum_{n=0}^{N_m-1} S_{k_m+n} R_m^n \qquad (1)$$

Equation (1) is executed subject to:

$$R_m = \max_{n=0}^{N_m-1} S_{k_m+n} + 1 \qquad (2)$$

and $$C_m < C \qquad (3)$$

where C is the alphabet size of $C_m$. The constraint of Equation (2) makes the set $S_{k_m+n}$, $n=0, \ldots, N_m-1$ uniquely decodable from $C_m$ (knowing both $N_m$ and $R_m$) while generating an integer $C_m$ of a minimum decodable value. In other words, $C_m$ is the smallest integer obtained by Equation (1) from which $S_{k_m+n}$ can be recovered. The information carried by the group of symbols $S_{k_m+n}$, $n=0, \ldots, N_m-1$ is thereby encapsulated in a new single symbol $C_m$.

The constraint of Equation (3) advantageously sets the size of the combined-symbol alphabet, thereby determining the size of the memory space required to hold the encoding and decoding tables. It also causes a typical inverse relation between the values of $S_{k_m+n}$ and the group size $N_m$. Note that groups of small-valued symbols tend to have more symbols in them. The larger the value of C, the larger $N_m$ tends to be and the more efficient the encoding tends to be—the price paid in return is the need for larger memory space. The value of C may be set, therefore, based on the available memory space. Typically, this value will advantageously be a power of two, such as, for example, $16, 32, \ldots$, or 8192. Note that the value of $C_m$ in Equation (1) is non-decreasing with $N_m$. The illustrative algorithm increments the group size $N_m$ until the constraint of Equation (3) is violated, at which point the m'th vector of symbols is fixed and the algorithm starts processing the next segment.

The illustrative algorithm advantageously proceeds until the segmentation is complete, producing M combined symbols with $\Sigma_m N_m = N$. The number of subframes M varies from one main frame to another. When used in a speech or audio coder, for example, M tends to be very small in frames of silence or background noise, and is larger in frames of high audio activity. It is, however, always much smaller then the size of the main frame.

Note that the above-described algorithm does not require that the next processed subframe should be the one immediately following the current one. Different processing orders may be employed in accordance with various illustrative embodiments of the present invention, and such different orders lead to different segmentations resulting in turn in different coding bit rates. Therefore, various possible strategies, many of which will be obvious to those skilled in the art, may be advantageously employed. For example, straightforward strategies may simply scan the frame in a left-to-right or right-to-left order, with a new segment starting where the previous one ended.

More sophisticated strategies, on the other hand, may be based on identifying areas of activity in the current frame. For example, areas of large symbols $S_n$ may be segmented first, resulting in a number of small-size segments, followed by the segmentation of areas of small symbols grouped into longer segments. Alternatively, one can start with low-level regions, finding the longer segments first. In many applications, such as, for example, when used with a Modified Discrete Cosine Transform ("MDCT") based coder, this may be advantageous—in the typical MDCT array, such areas of small symbols grouped together are very distinct due the large dynamic range of the transform coefficients and the typical structure of the audio spectrum. It other illustrative embodiments, it may be advantageous to apply several different segmentation algorithms, and to then use the segmentation leading to the lowest number of segments, or, if the lossless coding process is incorporated in the search, the shortest resultant output bit stream. Of course, more sophisticated strategies typically result in added algorithmic complexity. In the illustrative embodiments described in detail herein, the straightforward left-to-right method is employed, to keep such complexity as low as possible. It will be obvious to those skilled in the art that these (and other) more sophisticated segmentation methods may be used in other illustrative embodiments.

Overview of an Illustrative Embodiment Using a Fixed Radix Approach

In the illustrative VSVEC approach in accordance with the principles of the present invention as described above, the encoded data ($C_m$, $N_m$, and $R_m$, for each segment m) can be represented by three symbol streams. Alternatively, one may view this as a stream of the triplets $\{C_m, N_m, R_m\}$. In accordance with one illustrative embodiment of the present invention, each member of this triplet or pair is encoded individually, losslessly compressed and transmitted to a receiver for perfect reconstruction of the original sequence of symbols.

One way of reducing the number of symbols which must be coded and transmitted is to eliminate the radix stream. By using a fixed radix R, rather than a variable radix as described above, the need for this particular bit stream (or portion of the stream of triplets) is eliminated. On the other hand, however, the use of a variable radix has the advantage of increasing the length of the subframes for a given alphabet size (as compared to the fixed radix approach), thereby reducing the number of combined symbols which actually need to be coded. In sum, the use of a variable radix and the use of a fixed radix each has its advantages in terms of the number of bits required to code the sequence.

Therefore, in accordance with one illustrative embodiment of the present invention, a fixed radix approach is used in the segmentation process. In this case, the combined symbol is given by:

$$C_m = \sum_{n=0}^{N_m-1} S_{k_m+n} R^n \tag{4}$$

Equation (4) is successively executed with increasing $N_m$, subject to:

$$R > \max_{n=0}^{N_m-2} S_{k_m+n} \tag{5}$$

and $$C_m < C \tag{6}$$

The segment size $N_m$ is advantageously incremented until one or more of the above constraints is violated, at which point, a new segment starts. The search may proceed in a left-to-right direction for simplicity. Given this illustrative approach, there are now advantageously only two streams to code—the combined symbols and the associated segment sizes. Note that Equations (4) and (5) may be advantageously evaluated recursively for purposes of efficiency. Note also that the parameters R and C may be varied during performance measurements, and may then be advantageously set accordingly. Some possibly advantageous values of these parameters include:

(a) C=8192, R=25;
(b) C=512, R=25; and
(c) C=4096, R=20.

Specific Description of an Illustrative Encoder Embodiment Using a Fixed Radix

FIG. 1 shows a high-level flowchart of a first illustrative embodiment of an encoder in accordance with the principles of the present invention in which a variable-size vector of symbols is entropy coded. In accordance with this first illustrative embodiment, a fixed radix (R) is used. Thus, as illustratively shown in FIG. 1, a sequence of input quantization symbols 11 ($S_n$) is provided to segmentation module 12 for purposes of segmenting the sequence into variable-size vectors for entropy coding. Quantization symbol sequence 11 may, for example, comprise a sequence of quantization values representative of a frame of a speech, audio, or video signal, in accordance with, for example, a conventional lossy (speech, audio or video) coding technique. Segmentation module 12 produces a sequence of combined symbols 13 ($C_m$), each representative of a variable-size vector of the input quantization symbols, which are then advantageously Huffman coded by Huffman coding module 14. In addition, segmentation module 12 also produces a sequence of segment lengths 15 ($N_m$), corresponding to the sequence of combined symbols, which are then also advantageously Huffman coded, in this case by Huffman coding module 16. These two streams of Huffman coded data are then combined by multiplexer 18, in order to generate a final bit stream 19 in accordance with the principles of the present invention.

Figure 2:
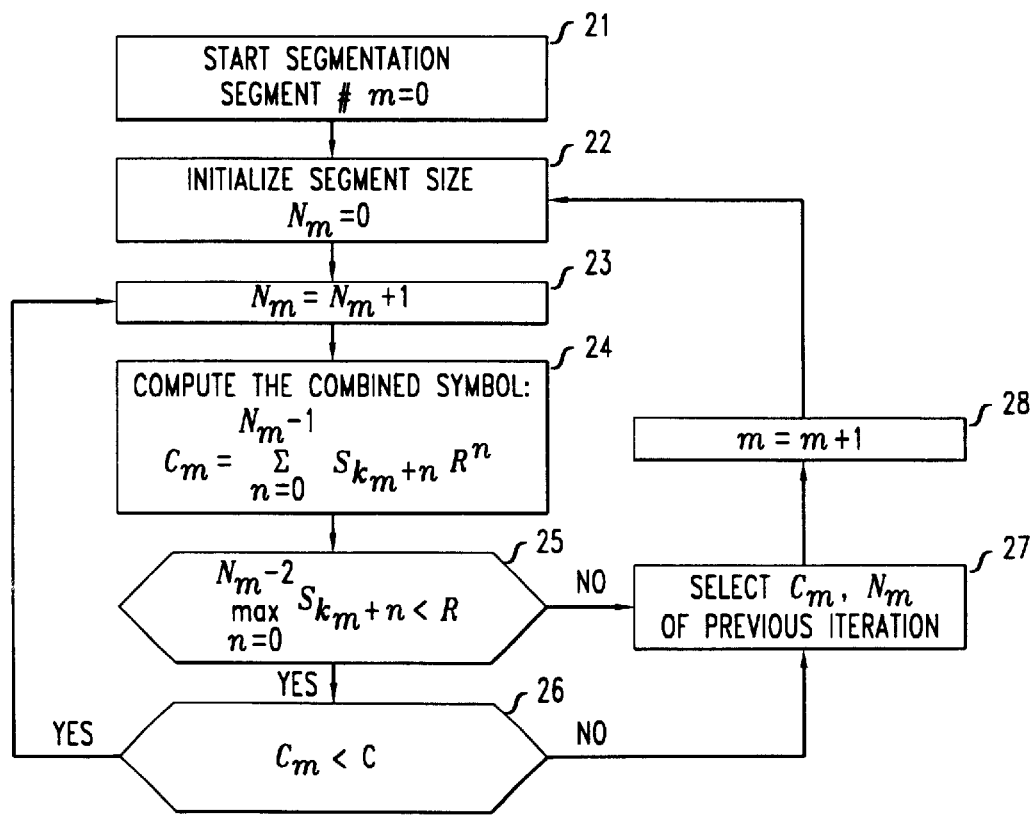
FIG. 2 shows a detailed flowchart of an illustrative segmentation process using fixed-radix arithmetic, which process may be advantageously employed in accordance with the first illustrative encoder embodiment of FIG. 1 in accordance with the principles of the present invention.

FIG. 2 shows a detailed flowchart of an illustrative segmentation process using fixed-radix arithmetic, which process may be advantageously employed in the implementation of segmentation module 12 in accordance with the first illustrative embodiment of an encoder in accordance with the principles of the present invention. Initially, flowchart block 21 begins the segmentation process by setting the segment number (m) to zero. The process then begins its outermost iteration (of two), which iteration determines the next segment (variable-size vector) which will be entropy coded. In particular, flowchart block 22 begins this (outermost) iteration by initializing the segment size ($N_m$) of the current segment to zero. The process then begins the innermost iteration which accumulates successive input symbols ($S_n$) until the variable-size vector has been determined. (The variable-size vector is advantageously made to be of the maximum possible size which can be coded in accordance with certain criteria.) In particular, flowchart block 23 increments the segment size by one, and flowchart block 24 computes the combined symbol ($C_m$) in accordance with equation (4), as defined above.

Given the computed combined symbol, flowchart decision block 25 ensures that none of the symbols which have been included in the vector and used in the computation of the combined symbol, with the possible exception of the last (i.e., the "highest order") symbol, have a numerical value which equals or exceeds the fixed radix (R). In particular, this test is performed in accordance with equation (5), as defined above. As previously explained, the satisfaction of this criterion is necessary to ensure that the vector of symbols can be uniquely decoded given only the numerical value of the combined symbol and the number of symbols in the vector. If the test of flowchart decision box 25 fails (i.e., if any of the symbols included in the vector have a numerical value that is not less that the fixed radix, R), control goes to flowchart block which causes the innermost iteration to "back up" to the previous iteration (i.e., the previous values of $C_m$ and $N_m$ are used to code the vector). Flow then proceeds with flowchart block 28 which advances the processing to the next segment and returns the flow to the outermost iteration at flowchart block 22.

If the test of flowchart decision block flowchart decision box 25 passes (i.e., if each of the symbols included in the vector have a numerical value that is less that the fixed radix, R), flowchart decision block 26 tests whether the numerical value of the combined symbol is within the (complexity) limit imposed (ie., whether the numerical value of $C_m$ is less than the alphabet size, C), in accordance with equation (6), as defined above. If this test fails, then again, flow proceeds to flowchart block 27 where the iteration is "backed up" to use the previous values of $C_m$ and $N_m$ for the present segment, and to proceed to the processing of the next segment. If the test of flowchart decision box 26 passes (i.e., the numerical value of $C_m$ is, in fact, less than the alphabet size, C), the innermost iteration continues with flowchart block 23, where the next symbol is considered for inclusion in the current segment (i.e., to be part of the current variable-size vector to be entropy coded).

Figure 3:
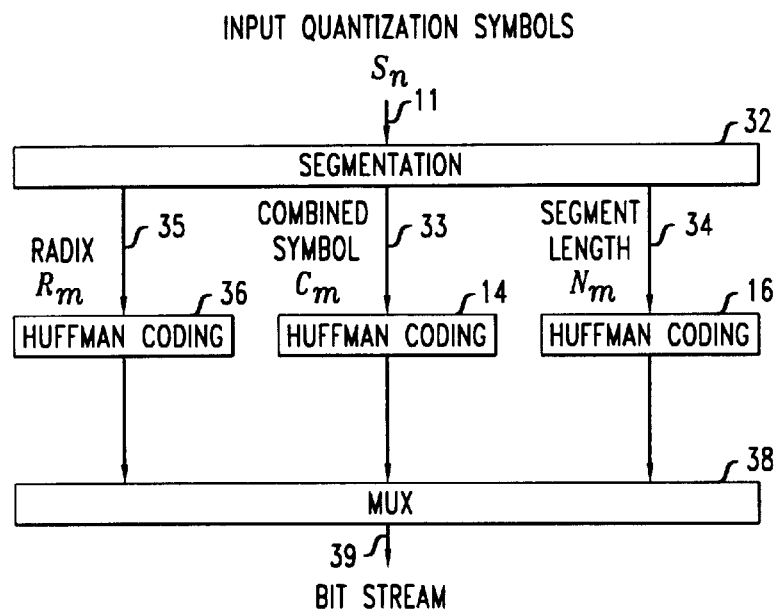
FIG. 3 shows a high-level flowchart of a second illustrative embodiment of an encoder in accordance with the principles of the present invention in which a variable-size vector of symbols is entropy coded with use of a variable radix.

Specific Description of an Illustrative Encoder Embodiment Using a Variable Radix FIG. 3 shows a high-level flowchart of a second illustrative embodiment of an encoder in accordance with the principles of the present invention in which a variable-size vector of symbols is entropy coded with use of a variable radix. The illustrative embodiment shown in FIG. 3 is similar to the embodiment shown in FIG. 1, except that segmentation block 32 of FIG. 3 (as opposed to segmentation block 12 of the illustrative embodiment shown in FIG. 1) generates a sequence of radix values 35 ($R_m$), in addition to a sequence of combined symbols 33 ($C_m$) representative of variable-size vectors of the input quantization symbol sequence 11, and a sequence of segment lengths 34 ($N_m$) corresponding thereto. Each of these sequences are advantageously Huffman coded by Huffman coding modules 36, 14 and 16, respectively. Finally, multiplexer 38 combines all three of these streams of Huffman coded data in order to generate a final bit stream 39 in accordance with the principles of the present invention.

Figure 4:
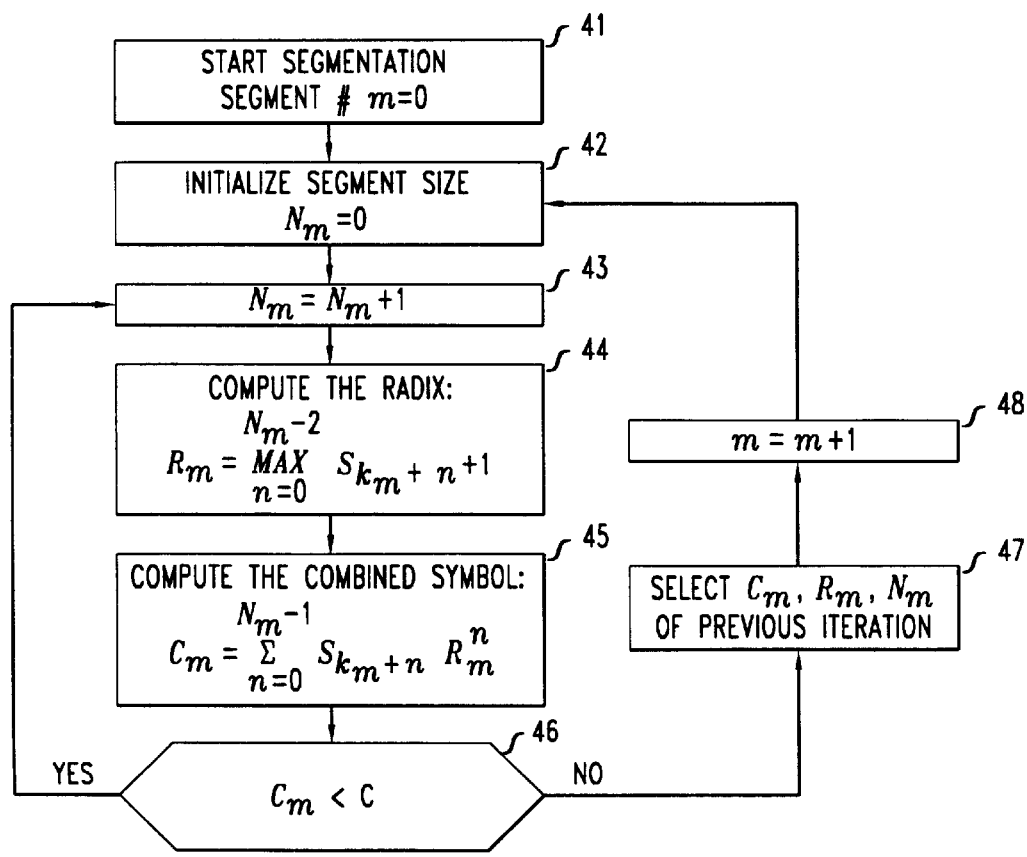
FIG. 4 shows a detailed flowchart of an illustrative segmentation process using variable-radix arithmetic, which process may be advantageously employed in accordance with the second illustrative encoder embodiment of FIG. 3 in accordance with the principles of the present invention.

FIG. 4 shows a detailed flowchart of an illustrative segmentation process using variable-radix arithmetic, which process may be advantageously employed in the implementation of segmentation module 32 in accordance with the second illustrative embodiment of an encoder in accordance with the principles of the present invention. The illustrative segmentation process of FIG. 4 is similar to the segmentation process shown in FIG. 2, except that the specific radix to be used in the computation of the combined symbol is not fixed to a predetermined value, but rather is determined based on the symbols which are being included in the given segment (i.e., the given variable-size vector).

Specifically, flowchart block 41 begins the segmentation process by setting the segment number (m) to zero. The process then begins its outermost iteration (of two), which iteration determines the next segment (variable-size vector) which will be entropy coded. In particular, flowchart block 42 begins this (outermost) iteration by initializing the segment size ($N_m$) of the current segment to zero. The process then begins the innermost iteration which accumulates successive input symbols ($S_n$) until the variable-size vector has been determined. (The variable-size vector is advantageously made to be of the maximum possible size which can be coded in accordance with certain criteria.) In particular, flowchart block 43 increments the segment size by one, and flowchart block 44 then determines the minimum value which can be acceptably be used for a radix, given the symbols contained in the proposed segment. This computation is performed in accordance with equation (2), as defined above. Note in particular that the radix ($R_m$) is computed to have a value equal to one more than the maximum value of all of the symbols which have been included in the vector, with the exception of the last (i.e., the "highest order") symbol. As previously explained, the satisfaction of this criterion is necessary to ensure that the vector of symbols can be uniquely decoded given only the numerical value of the combined symbol and the number of symbols in the vector. Then, using the determined value for the radix, flowchart block 45 computes the combined symbol ($C_m$) in accordance with equation (1), as also defined above.

Given the computed combined symbol, flowchart decision block 46 tests whether the numerical value of the combined symbol is within the (complexity) limit imposed (i.e., whether the numerical value of $C_m$ is less than the alphabet size, C), in accordance with equation (3), as defined above. If this test fails, then flow proceeds to flowchart block 47 where the iteration is "backed up" to use the previous values of $C_m$, $R_m$, and $N_m$ for the present segment, and to proceed to the processing of the next segment. If the test of flowchart decision box 46 passes (i.e., the numerical value of $C_m$ is, in fact, less than the alphabet size, C), the innermost iteration continues with flowchart block 43, where the next symbol is considered for inclusion in the current segment (i.e., to be part of the current variable-size vector to be entropy coded).

Overview of an Illustrative Embodiment Using Super-Symbols

As pointed out above, in the illustrative VSVEC approach in accordance with the embodiments described above, the encoded data can be represented by either two or three symbol streams (depending on whether a fixed or variable radix scheme is used), and can alternatively be viewed as a stream of the triplets $\{C_m, N_m, R_m\}$ or of the pairs $\{C_m, N_m\}$.

In accordance with the illustrative embodiments of the present invention described above, each member of this triplet or pair is encoded individually, losslessly compressed and transmitted to a receiver for perfect reconstruction of the original sequence of symbols. Since all three streams originate from the same source, however, it is reasonable to assume that they are at least somewhat statistically redundant (i.e., that they carry mutual information). Thus, in accordance with other illustrative embodiments of the present invention, it may be advantageous to reduce the number of streams by coding two (or even all three) of these streams in a combined manner.

Thus, in accordance with certain additional illustrative embodiments of the present invention, the combined symbol ($C_m$) is advantageously further combined with the associated segment size ($N_m$) into a single "super-symbol." If this method is based on fixed-radix arithmetic, the necessary encoding may be advantageously reduced to a single bit stream. Specifically, then, assuming the use of the fixed radix approach, the super-symbol $U_m$ is given by $$U_m = \begin{cases} N_x \sum_{n=0}^{N_m-1} S_{k_m+n} R^n + N_m - 1; & N_m < N_x \\ N_x(N_m - N_x) + N_x - 1; & N_m \geq N_x \end{cases} \quad (7)$$

where $k_m$ is as defined previously, and where $N_x \leq N$ is a parameter which is set to a largest permitted segment size for non-zero symbols. Equation (7) is successively executed with increasing $N_m$, subject to:

$$S_{k_m+n} = 0, n=0, \ldots, N_m-1 \text{ if } N_m \geq N_x \quad (8)$$

$$R > \max_{n=0}^{N_m-2} S_{k_m+n} \quad (9)$$

$$U_m < C \quad (10)$$

and $$N_m < N_x \quad (11)$$

A new segment starts when one or more of the above constraints is not met. Note that this is the first described embodiment in which a limit (although a "soft" one) is advantageously set on the segment size, specifically in the form of Equation (11). Such a limit causes all segments of size greater than $N_x$ to be of all-zero elements. In this way, segments of any size are possible, without excessively increasing the range of $U_m$, which might result in an unmanageable the Huffman table size. Moreover, the constraint of Equation (11) advantageously makes Equation (7) uniquely decodable.

Note that $N_x$ is a parameter which may be varied, along with the parameters R and C, during performance measurements, and may be advantageously set accordingly. For example, some possibly advantageous values of these parameters include:

(a) C=2048, R=5, and $N_x$=20;

(b) C=4096, R=5, and $N_x$=25; and (c) C=8192, R=5, and $N_x$=30.

Specific Description of Illustrative Encoder Embodiments Using Super-Symbols

Figure 5:
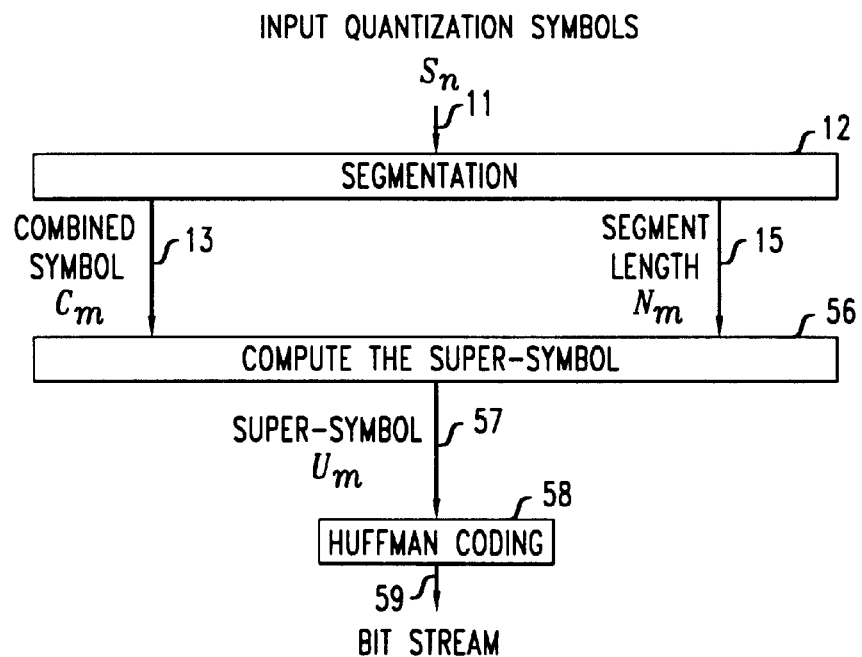
FIG. 5 shows a high-level flowchart of a third illustrative embodiment of an encoder in accordance with the principles of the present invention in which a variable-size vector of symbols is entropy coded as a super-symbol in combination with its associated segment length and with use of a fixed radix.

FIG. 5 shows a high-level flowchart of a third illustrative embodiment of an encoder in accordance with the principles of the present invention in which a variable-size vector of symbols is entropy coded as a super-symbol in combination with its associated segment length. In particular, the illustrative encoder embodiment shown in FIG. 5 is identical to that shown in FIG. 1, except that each of the combined symbols 13 ($C_m$) and its corresponding segment length 15 ($N_m$) are advantageously combined into a single "super-symbol" as described above and shown in equation (7), by computation module 56. Thus, a sequence of super-symbols 57 ($U_m$) is produced, which is Huffman coded by Huffman coding module 58 to generate final bit stream 59 in accordance with the principles of the present invention.

Figure 6:
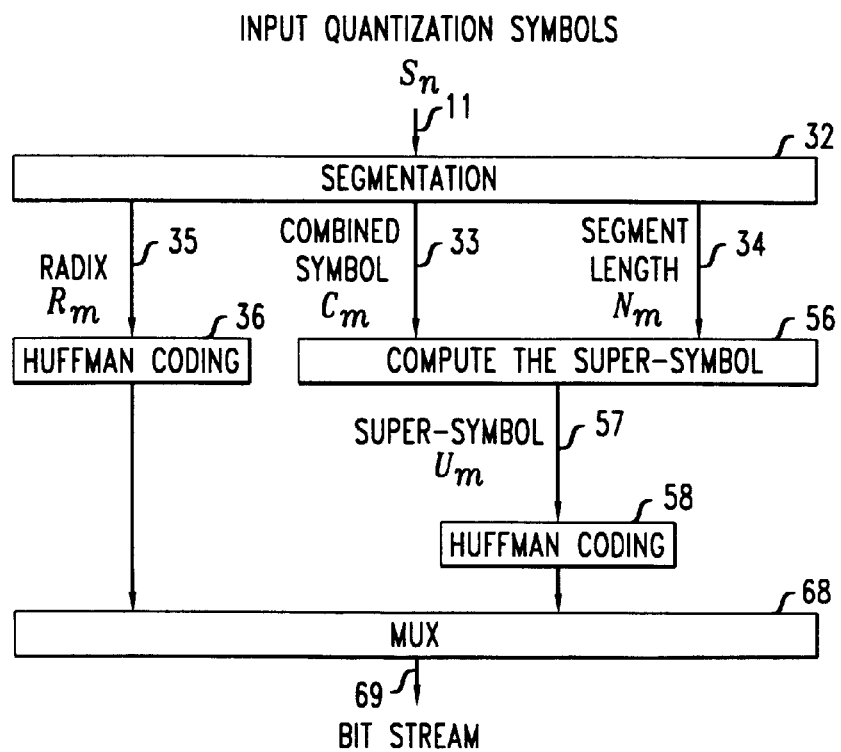
FIG. 6 shows a high-level flowchart of a fourth illustrative embodiment of an encoder in accordance with the principles of the present invention in which a variable-size vector of symbols is entropy coded as a super-symbol in combination with its associated segment length and with use of a variable radix.

FIG. 6 shows a high-level flowchart of a fourth illustrative embodiment of an encoder in accordance with the principles of the present invention in which a variable-size vector of symbols is entropy coded as a super-symbol in combination with its associated segment length with use of a variable radix. In essence, this illustrative encoder embodiment combines the features of both the illustrative encoder embodiment of FIG. 3 (i.e., the use of a variable radix) and the illustrative encoder embodiment of FIG. 5 (i.e., the use of a super-symbol to code a combination of the combined symbol and the segment length). Specifically, the illustrative encoder embodiment shown in FIG. 6 is identical to that shown in FIG. 3, except that each of the combined symbols 33 ($C_m$) and its corresponding segment length 34 ($N_m$) are advantageously combined into a single "super-symbol" as described above and shown in equation (7), by computation module 56 (in an identical fashion as in the illustrative encoder embodiment shown in FIG. 5). Thus, a sequence of super-symbols 57 ($U_m$) is produced, which is Huffman coded by Huffman coding module 58, and which is then combined with the Huffman coded data representative of the sequence of radix values 35 ($R_m$) by multiplexer 68 in order to generate final bit stream 69 in accordance with the principles of the present invention.

Description of Various Illustrative Decoder Embodiments

The implementation of various illustrative decoder embodiments, corresponding, for example, to each of the illustrative encoder embodiments described above, will be clearly obvious to those of ordinary skill in the art. More specifically, for example, for each segment (i.e., variable-size vector) to be decoded, the number of symbols (i.e., vector elements) which have been combined for coding purposes in the given vector will be first determined by decoding the segment length data ($N_m$)—either directly if the encoding was performed, for example, by one of the illustrative encoder embodiment of FIG. 1 or FIG. 3, or indirectly from the coded "super-symbol" if the encoding was performed, for example, by one of the illustrative encoder embodiment of FIG. 5 or FIG. 6. Then, if one of the fixed radix encoder embodiments (i.e., the illustrative encoder embodiments of FIG. 1 or FIG. 5) has been used to perform the encoding, then the individual symbols of the vector can be determined from a decoding of the coded combined symbol representative of the vector (which combined symbol may be decoded directly if the encoding was performed, for example, by the illustrative encoder embodiment of FIG. 1, or indirectly from the coded "super-symbol" if the encoding was performed, for example, by the illustrative encoder embodiment of FIG. 5), based on the determined number of symbols contained in the given vector and on the fixed radix.

If, on the other hand, one of the variable radix encoder embodiments (i.e., the illustrative encoder embodiments of FIG. 3 or FIG. 6) has been used to perform the encoding, then the applicable radix value for the given vector must be determined (by decoding the encoded radix data) before the individual symbols of the vector can be determined (from a decoding of the coded combined symbol representative of the vector and based on both the determined number of symbols contained in the vector and on the determined variable radix). Note that in all of these cases, the mathematics required for the determination of each of the individual symbol values based on the combined symbol value, the determined number of symbols in the vector (i.e., the vector length), and the radix (whether fixed or variable), consists of straightforward radix arithmetic which will be clearly obvious to those of ordinary skill in the art.

Addendum to the Detailed Description

The above description of various illustrative embodiments of the present invention should be understood to be generally limited to the description of the inventive entropy coding technique itself, understanding that this inventive technique may be advantageously incorporated in any of a number of coding systems directed to the encoding of any one of a number of possible types of data and/or signals (electrical or otherwise). For example, coding systems used for the coding of speech, audio, video, or (any one of a number of possible) biometric signals, may incorporate the inventive lossless coding technique of the present invention, and may or may not further employ any one of many conventional lossy coding techniques in cooperation therewith—i.e., in cooperation with lossless coding in accordance with any one of the various illustrative embodiments of the present invention.

By way of one single example (of many), a speech coder which includes a lossy coding algorithm may comprise a conventional transform coder that employs the commonly used and well-known Modified Discrete Cosine Transform ("MDCT"), fully familiar to those of ordinary skill in the art. Such a coder may perform lossy coding of the MDCT coefficients by using a set of scalar quantizers, or alternatively, a set of low-dimensional vector quantizers. The resolution of these quantizers may, for example, be dynamically adjusted by a perceptual control unit ("PCU") such that the resulting quantization distortion is the least annoying perceptually. Then, in accordance with the principles of the present invention, the symbols emitted from these quantizers may be advantageously subjected to one of the above-described illustrative embodiments of the inventive VSVEC technique for further lossless compression in accordance with the principles of the present invention.

In addition, it should be noted that all of the preceding discussion merely illustrates the general principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future—i.e., any elements developed that perform the same function, regardless of structure.

Thus, for example, it will be appreciated by those skilled in the art that the block diagrams herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown.

The functions of the various elements shown in the figures, including functional blocks labeled as "processors" or "modules" may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementer as more specifically understood from the context.

In the claims hereof any element expressed as a means for performing a specified function is intended to encompass any way of performing that function including, for example, (a) a combination of circuit elements which performs that function or (b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent (within the meaning of that term as used in 35 U.S.C. 112, paragraph 6) to those explicitly shown and described herein.

What is claimed is:

1. A method of performing entropy coding of a sequence of symbols, each of said symbols having a numerical value associated therewith, the method comprising the steps of:

identifying a first subsequence of said symbols, the first subsequence of said symbols having a first number of symbols included therein, the first number of symbols being based on the numerical values associated with said symbols included in said first subsequence of said symbols and further based on a size of a set of combined symbols;

coding the first subsequence of symbols with use of a first combined symbol representative of said first subsequence of symbols and with use of a symbol representative of the first number of symbols, wherein said first combined symbol is a member of said set of combined symbols;

identifying a second subsequence of said symbols, the second subsequence of said symbols having a second number of symbols included therein, the second number of symbols being based on the numerical values associated with said symbols included in said second subsequence of said symbols and further based on said size of said set of combined symbols, wherein said second number of symbols differs from said first number of symbols; and coding the second subsequence of symbols with use of a second combined symbol representative of said second subsequence of symbols and with use of a symbol representative of the second number of symbols, wherein said second combined symbol is a member of said set of combined symbols.

2. The method of claim 1 wherein the sequence of symbols comprises a frame of a coded signal, and wherein the method further comprises identifying and coding additional subsequences of symbols such that the frame is coded with use of a sequence of combined symbols representative of said subsequences of symbols and with use of a corresponding sequence of symbols representative of corresponding numbers of symbols included therein.

3. The method of claim 2 wherein said coded signal comprises a coded speech signal.

4. The method of claim 2 wherein said coded signal comprises a coded audio signal.

5. The method of claim 2 wherein said coded signal comprises a coded video signal.

6. The method of claim 1 wherein said first combined symbol and said second combined symbol are encoded with use of a Huffman coding.

7. The method of claim 1 wherein said symbol representative of the first number of symbols and said symbol representative of the second number of symbols are encoded with use of a Huffman coding.

8. The method of claim 1 wherein the first subsequence of symbols is coded with use of a first super-symbol representative of a combination of said first combined symbol and said first number of symbols, and wherein the second subsequence of symbols is coded with use of a second super-symbol representative of a combination of said second combined symbol and said second number of symbols.

9. The method of claim 8 wherein said first super-symbol and said second super-symbol are encoded with use of a Huffman coding.

10. The method of claim 1 wherein said first number of symbols is further based on a first numerical radix and wherein said second number of symbols is further based on a second numerical radix.

11. The method of claim 10 wherein said first combined symbol and said second combined signal are each derived with use of radix arithmetic, said first combined symbol computed as a summation of products of each of the numerical values associated with said symbols included in said first subsequence of said symbols, multiplied by the first numerical radix raised to a corresponding power, and said second combined symbol computed as a summation of products of each of the numerical values associated with said symbols included in said second subsequence of said symbols, multiplied by the second numerical radix raised to a corresponding power.

12. The method of claim 10 wherein said first numerical radix and said second numerical radix are equal to each other and set to a predetermined value.

13. The method of claim 10 wherein said first numerical radix is also based on the numerical values associated with said symbols included in said first subsequence of said symbols, wherein said second numerical radix is also based on the numerical values associated with said symbols included in said second subsequence of said symbols, wherein said first subsequence of said symbols is coded further with use of a symbol representative of said first numerical radix, and wherein said second subsequence of said symbols is coded further with use of a symbol representative of said second numerical radix.

14. The method of claim 13 wherein the first numerical radix is set to a value which exceeds at least one of the numerical values associated with said symbols included in said first subsequence of said symbols, and wherein the second numerical radix is set to a value which exceeds at least one of the numerical values associated with said symbols included in said second subsequence of said symbols.

15. The method of claim 13 wherein said symbol representative of said first numerical radix and said symbol representative of said second numerical radix are encoded with use of a Huffman coding.

16. An apparatus for performing entropy coding of a sequence of symbols, each of said symbols having a numerical value associated therewith, the apparatus comprising:

means for identifying a first subsequence of said symbols, the first subsequence of said symbols having a first number of symbols included therein, the first number of symbols being based on the numerical values associated with said symbols included in said first subsequence of said symbols and further based on a size of a set of combined symbols;

a coder which codes the first subsequence of symbols with use of a first combined symbol representative of said first subsequence of symbols and with use of a symbol representative of the first number of symbols, wherein said first combined symbol is a member of said set of combined symbols;

means for identifying a second subsequence of said symbols, the second subsequence of said symbols having a second number of symbols included therein, the second number of symbols being based on the numerical values associated with said symbols included in said second subsequence of said symbols and further based on said size of said set of combined symbols, wherein said second number of symbols differs from said first number of symbols; and a coder which codes the second subsequence of symbols with use of a second combined symbol representative of said second subsequence of symbols and with use of a symbol representative of the second number of symbols, wherein said second combined symbol is a member of said set of combined symbols.

17. The apparatus of claim 16 wherein the sequence of symbols comprises a frame of a coded signal, and wherein the apparatus further comprises means for identifying and coding additional subsequences of symbols such that the frame is coded with use of a sequence of combined symbols representative of said subsequences of symbols and with use of a corresponding sequence of symbols representative of corresponding numbers of symbols included therein.

18. The apparatus of claim 17 wherein said coded signal comprises a coded speech signal.

19. The apparatus of claim 17 wherein said coded signal comprises a coded audio signal.

20. The apparatus of claim 17 wherein said coded signal comprises a coded video signal.

21. The apparatus of claim 16 wherein said first combined symbol and said second combined symbol are encoded with use of a Huffman coding.

22. The apparatus of claim 16 wherein said symbol representative of the first number of symbols and said symbol representative of the second number of symbols are encoded with use of a Huffman coding.

23. The apparatus of claim 16 wherein the first subsequence of symbols is coded with use of a first super-symbol representative of a combination of said first combined symbol and said first number of symbols, and wherein the second subsequence of symbols is coded with use of a second super-symbol representative of a combination of said second combined symbol and said second number of symbols.

24. The apparatus of claim 23 wherein said first super-symbol and said second super-symbol are encoded with use of a Huffman coding.

25. The apparatus of claim 16 wherein said first number of symbols is further based on a first numerical radix and wherein said second number of symbols is further based on a second numerical radix.

26. The apparatus of claim 25 wherein said first combined symbol and said second combined signal are each derived with use of radix arithmetic, said first combined symbol computed as a summation of products of each of the numerical values associated with said symbols included in said first subsequence of said symbols, multiplied by the first numerical radix raised to a corresponding power, and said second combined symbol computed as a summation of products of each of the numerical values associated with said symbols included in said second subsequence of said symbols, multiplied by the second numerical radix raised to a corresponding power.

27. The apparatus of claim 25 wherein said first numerical radix and said second numerical radix are equal to each other and set to a predetermined value.

28. The apparatus of claim 25 wherein said first numerical radix is also based on the numerical values associated with said symbols included in said first subsequence of said symbols, wherein said second numerical radix is also based on the numerical values associated with said symbols included in said second subsequence of said symbols, wherein said first subsequence of said symbols is coded further with use of a symbol representative of said first numerical radix, and wherein said second subsequence of said symbols is coded further with use of a symbol representative of said second numerical radix.

29. The apparatus of claim 28 wherein the first numerical radix is set to a value which exceeds at least one of the numerical values associated with said symbols included in said first subsequence of said symbols, and wherein the second numerical radix is set to a value which exceeds at least one of the numerical values associated with said symbols included in said second subsequence of said symbols.

30. The apparatus of claim 28 wherein said symbol representative of said first numerical radix and said symbol representative of said second numerical radix are encoded with use of a Huffman coding.

31. A method of decoding a bit stream, the bit stream comprising an entropy encoding of an original sequence of symbols, each of said symbols in said original sequence having a numerical value associated therewith, the method comprising the steps of:
  decoding a portion of said bit stream which comprises a coded symbol representative of a number of symbols which are included in a given subsequence of said original sequence and which have been coded with use of a combined symbol, thereby determining said number of symbols which have been combined in said subsequence;
  decoding a portion of said bit stream which comprises said coded combined symbol representative of said subsequence of symbols in said original sequence, said subsequence containing said determined number of symbols; and
  determining said numerical values associated with said symbols in said subsequence based on the decoded portion of said bit stream which comprises said coded combined symbol, and further based on said determined number of symbols and on a numerical radix.

32. The method of claim 31 wherein the original sequence of symbols comprises a frame of a coded signal, and wherein the method further comprises decoding one or more other portions of said bit stream to thereby decode a plurality of subsequences of said original sequence which together represent said frame.

33. The method of claim 32 wherein said coded signal comprises a coded speech signal.

34. The method of claim 32 wherein said coded signal comprises a coded audio signal.

35. The method of claim 32 wherein said coded signal comprises a coded video signal.

36. The method of claim 31 wherein said portion of said bit stream which comprises said coded symbol representative of said number of symbols which are included in said given subsequence of said original sequence and which have been coded with use of said combined symbol, and said portion of said bit stream which comprises said coded combined symbol representative of said subsequence of symbols in said original sequence, each comprise the same portion of said bit stream, said number of symbols and said combined symbol having been encoded together with use of a super-symbol.

37. The method of claim 31 wherein said step of determining said numerical values associated with said symbols in said subsequence is performed with use of radix arithmetic by extracting said numerical values from a value of said combined symbol based on said number of symbols which are included in said given subsequence of said symbols and based on said numerical radix, said value of said combined symbol having been computed as a summation of products of each of the numerical values associated with said symbols comprised in said given subsequence of said symbols multiplied by said numerical radix raised to a corresponding power.

38. The method of claim 31 wherein said numerical radix comprises a predetermined fixed value.

39. The method of claim 31 further comprising the step of determining said numerical radix by decoding a portion of said bit stream which comprises a coded symbol representative of said numerical radix upon which said step of determining said numerical values associated with said symbols is based.

40. An apparatus for decoding a bit stream, the bit stream comprising an entropy encoding of an original sequence of symbols, each of said symbols in said original sequence having a numerical value associated therewith, the apparatus comprising:
  means for decoding a portion of said bit stream which comprises a coded symbol representative of a number of symbols which are included in a given subsequence of said original sequence and which have been coded with use of a combined symbol, thereby determining said number of symbols which have been combined in said subsequence; means for decoding a portion of said bit stream which comprises said coded combined symbol representative of said subsequence of symbols in said original sequence, said subsequence containing said determined number of symbols; and means for determining said numerical values associated with said symbols in said subsequence based on the decoded portion of said bit stream which comprises said coded combined symbol, and further based on said determined number of symbols and on a numerical radix.

41. The apparatus of claim 40 wherein the original sequence of symbols comprises a frame of a coded signal, and wherein the apparatus further comprises means for decoding one or more other portions of said bit stream to thereby decode a plurality of subsequences of said original sequence which together represent said frame.

42. The apparatus of claim 41 wherein said coded signal comprises a coded speech signal.

43. The apparatus of claim 41 wherein said coded signal comprises a coded audio signal.

44. The apparatus of claim 41 wherein said coded signal comprises a coded video signal.

45. The apparatus of claim 40 wherein said portion of said bit stream which comprises said coded symbol representative of said number of symbols which are included in said given subsequence of said original sequence and which have been coded with use of said combined symbol, and said portion of said bit stream which comprises said coded combined symbol representative of said subsequence of symbols in said original sequence, each comprise the same portion of said bit stream, said number of symbols and said combined symbol having been encoded together with use of a super-symbol.

46. The apparatus of claim 40 wherein said means for determining said numerical values associated with said symbols in said subsequence is performed with use of radix arithmetic by extracting said numerical values from a value of said combined symbol based on said number of symbols which are included in said given subsequence of said symbols and based on said numerical radix, said value of said combined symbol having been computed as a summation of products of each of the numerical values associated with said symbols comprised in said given subsequence of said symbols multiplied by said numerical radix raised to a corresponding power.

47. The apparatus of claim 40 wherein said numerical radix comprises a predetermined fixed value.

48. The apparatus of claim 40 further comprising means for determining said numerical radix by decoding a portion of said bit stream which comprises a coded symbol representative of said numerical radix upon which said means for determining said numerical values associated with said symbols is based.

* * * * *